United States Patent [19]

Glovatsky et al.

[11] Patent Number: 5,407,865
[45] Date of Patent: Apr. 18, 1995

[54] METHOD OF MANUFACTURING A FLEXIBLE METALLIZED POLYMER FILM COVER FOR ENVIRONMENTAL PROTECTION OF ELECTRONIC ASSEMBLIES

[75] Inventors: Andrew Z. Glovatsky, Johnson City; Michael A. Mele, Endicott; Patrick M. Scott, Newark Valley, all of N.Y.

[73] Assignee: Loral Federal Systems Company, Manassas, Va.

[21] Appl. No.: 206,309

[22] Filed: Mar. 4, 1994

Related U.S. Application Data

[62] Division of Ser. No. 934,604, Aug. 25, 1992, Pat. No. 5,318,855.

[51] Int. Cl.$^6$ ...................... H01L 21/52; H01L 21/84
[52] U.S. Cl. .................................. 437/212; 437/215; 437/216; 437/222; 257/704
[58] Field of Search ............... 437/212, 222, 216, 215; 257/704

[56] References Cited

U.S. PATENT DOCUMENTS

| | | | |
|---|---|---|---|
| 5,059,558 | 10/1991 | Tatsanakit et al. | 437/216 |
| 5,135,890 | 8/1992 | Temple et al. | 437/216 |
| 5,166,773 | 11/1992 | Temple et al. | 257/704 |

*Primary Examiner*—Olik Chaudhuri
*Assistant Examiner*—David E. Graybill
*Attorney, Agent, or Firm*—Bernard Tiegerman; William H. Steinberg

[57] ABSTRACT

A process of manufacturing a flexible metallized polymer film cover which provides environmental protection of electronic assemblies such as circuit card assemblies which are susceptible to external environmental factors which can impede functional performance and reduce reliability. The use of a metallized polymer film in the form of a two layer film, with two intimately bonded layers one being electrically insulative and the other metallic, provides environmental and electrical protection of the enclosed assembly.

5 Claims, 1 Drawing Sheet

METHOD OF MANUFACTURING A FLEXIBLE METALLIZED POLYMER FILM COVER FOR ENVIRONMENTAL PROTECTION OF ELECTRONIC ASSEMBLIES

This is a division of application Ser. No. 08/934,604, filed 25 Aug. 1992, now U.S. Pat. No. 5,318,855.

FIELD OF THE INVENTION

This invention relates to computer circuit card assemblies and devices; particularly to the cover or enclosure method of protecting the the assembly from environmental and electrical affects.

GLOSSARY OF TERMS

While dictionary meanings are also implied by certain terms used here, the following glossary of some terms may be useful.

Cover—A physical structure used to enclose or obscure a specific device or circuit card assembly from external environmental influences.

Sputter—A physical vapor deposition process that deposits a specific material, such as metal, from a target onto another given material substrate, such as a polymer.

Lamination—The use of a platen press, to press a polymer film and a metal film together, under specific parameters, to create an intimate bond between the two films.

Film—A thin layer of material, either polymer, metal, bi-layer or multilayered film.

Etching—A molecular process in which an etchant dissolves or removes a specific material. Typical processes are plasma or chemical etching.

Ablation—The removal of a material through evaporation or vaporization through the use of an applied energy, such as laser ablation.

BACKGROUND OF THE INVENTION

As background for our invention, circuit cards and devices have been protected from environmental effects by polymeric encapsulation, metal covers, hermetically sealed metal or ceramic covers and combinations of the aforementioned techniques. The encapsulation or potting methods provide conformal coating but the coating does not provide a hermetic barrier to moisture permeation or chemical diffusion. It also does not provide reliable EMI/ESD protection for the underlying hardware. Standard formed or machined metal covers or dust covers are only mechanically fastened over the assembly and do not provide environmental protection or complete EMI protection.

Hermetically sealed covers of ceramic or metal do provide environmental protection but tend to be bulky, heavy and expensive. Both cover methods, do not insure EMI/ESD protection, depending upon the configuration. The metal covers also tend to add unwanted dimension and weight to the assembly.

Furthermore, use of electrostatic discharge (ESD) bags and ESD bag material for a cover work in protection of underlying hardware from mild electrical effects but does not provide the hermetic environmental protection. The polymeric bags are suseptible to chemical diffusion and moisture permeation. Numerous ESD bags are available on the market, but none provide satisfactory results. The ESD bags have metallized layers that are too thin to prevent permeation or diffusion of external media through the metal layer.

However, new and existing film metallization processes, such as magnetron sputtering and roll plating, along with development of high performance polymer films are allowing for the feasible design of light weight, formable and hermetic metallized polymer film covers to replace or enhance the above techniques for protection of electronic devices and assemblies.

SUMMARY OF THE INVENTION

Our invention provides a film cover which can be fabricated via numerous techniques, two of which being lamination or sputtering followed with plating of, a polymer film with a metal layer. The only difference between the fabrication techniques, is the adhesive strength of the bondline, which would affect the reliability of the film cover during use in the field. We have designed and fabricated a two layer or bi-layer film of metal and polymer. This film provides external environmental and electrical protection for underlying components and devices. It also has an insulative film layer which faces the components and devices to protect them from shorting to the metal layer.

The improvements which we have made achieves a light weight, conformable and flexible bi-layer film that provides environmental and electrical protection of enclosed electronic devices and assemblies.

This invention has been accomplished by use of existing and emerging bonding methods between polymers and metals. This film can take advantage of numerous techniques to metallize polymer film, such as physical vapor deposition (sputtering), chemical vapor deposition (CVD), metal evaporation, adhesive bonding, or lamination techniques. The detail of the chemical and physical interactions of the materials and the type of process employed can be chosen as needed for the cover design.

The final stages of the film fabrication require the removal of the insulative polymer layer to create a metal frame or border around the periphery of the film cover. Refer to FIG. 1. The polymer removal can be achieved through mechanical milling, etching or laser ablation.

These and other improvements are set forth in the following detailed description. For a better understanding of the invention with advantages and features, refer to the description and to the drawings.

Figure 1:
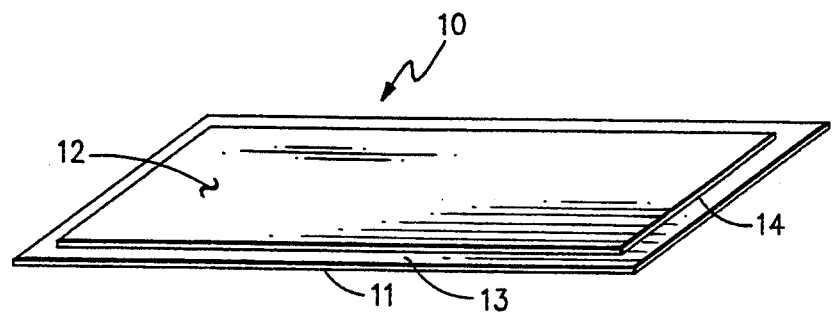
FIG. 1 shows schematically an overview of the preferred embodiment and particularly shows a flexible metallized polymer film cover.

Our detailed description explains the preferred embodiments of our invention, together with advantages and features, by way of example with reference to the following drawings.

DETAILED DESCRIPTION OF THE INVENTION

Electronic circuit card assemblies and electronic devices require protection from many facets of the environment that can be detrimental to the operation or life of the assembly. These items include; biological contaminants, chemicals, moisture, electrical interferences, electrical static discharges and physical damage.

The traditional method of protecting an assembly was to coat the assembly with a conformal polymeric coating and then mechanically attach a metal cover over the entire circuit board assembly. However, the conformal coating is very difficult to remove for subsequent rework of the assembly. This coating removal is time consuming and can cause further unwanted damage to the assembly.

Similarly, hybrid circuits and discrete electronic components are protected by hermetically sealing a cover of metal or ceramic over a metal or ceramic package which houses the circuit card and/or integrated chips. Hermetic sealing implies that there is an airtight seal. Thus a hermetic package would be an enclosed circuit assembly or chip containing package which is sealed from the surrounding environment. This sealing insures that the device will function as designed and not be affected by external factors previously discussed.

This invention embodies the traditional concepts of enclosure design but has employed the use of advanced metallization processes and polymer film technology to create a more advanced and efficient design. The use of a metallized film with one metal surface and the other an insulative polymer, creates a fully integrated cover that can be hermetically sealed over an assembly, individual components or over integrated circuit chips. This cover is thinner than conventional covers and flexible such that it can be formed to the contours of the assembly, thus cutting down on excess dead space above the assembly. The thickness of the metal film is less than in the traditional methods but is designed to provide the environmental protection required for the life of the assembly. The use of a 0.001 inch or greater metal layer is adequate to meet most commercial, military and space applications. The insulative layer will also be approximately 0.001 inch or greater depending on the polymer properties.

The two main techniques for fabrication of the film are either lamination or physical vapor deposition processes. Lamination requires that a sheet of polymer, not fully cured or hardened, be placed on a metal foil in a platen press. The press is activated by applying a large force to the laminate and heat is typically added to promote the polymeric/metal adhesion. After the cycle, the sheets are now joined as one and are referred to as a laminate.

A border of metal is required around the periphery of the film cover, so that the cover can be welded or metallurgically bonded (soldered) to the assembly frame. A frame or border of polymer is removed from the laminate by machining, laser ablation or etching. Finally, the metal can be plated or coated with other metals or coatings for protection. The cover is now ready for use to replace the previously described methods.

The sputtering process is quite different from the lamination process. This requires a film of polymer to be sputtered coated with metal from a given target. This occurs in equipment referred to as a sputter chamber. This process is generally referred to as a glow discharge process, employing a voltage induced plasma to generate metal atoms from a given target, which are then transported through the plasma and deposited on the substrate, in this case the polymer. The metallizing sequence and process parameters are critical in controlling this process. Once the initial metal layer is applied to the polymer, the roll can be further plated to any given thickness by traditional electroplating techniques. Finally, the edge border of the film is created in the same manner as for the lamination process, typically by etching.

The Preferred Embodiment

Turning now to our invention in greater detail, it will be seen from FIG. 1 which illustrates our preferred embodiment, that a metallized polymer film can be used to provide environmental and electrical protection for any given electronic assembly, component or device. The basic film design is identified by the reference numeral 10.

The invention is comprised of a two layer system which is intimately bonded together to form a single film. The two layers must be such that one is a metal for electrical conduction purposes, mechanical formability, and for protection from diffusion of elements through the film. These features are controlled by the material selected and the thickness of the metallic layer. This layer is identified by numeral 11. The other layer must be such that it is electrically insulative in nature, can be bonded or coated with the above mentioned metal, exhibit flexible characteristics and provide specific properties. This layer is identified by numeral 12. Again, these property characteristics are controlled by the material properties and design thickness. Finally, the film takes on its own unique physical properties based on the interaction of the the two layers.

The film can be designed in numerous ways, but requires a metal edge or border extending beyond the polymer layer. This metal edge will act a the metallurgical bonding site for attachment of the film to a frame or chassis. This is identified by numeral 13 and numeral 14 shows the intimate bondline between the two layers.

Figure 2:
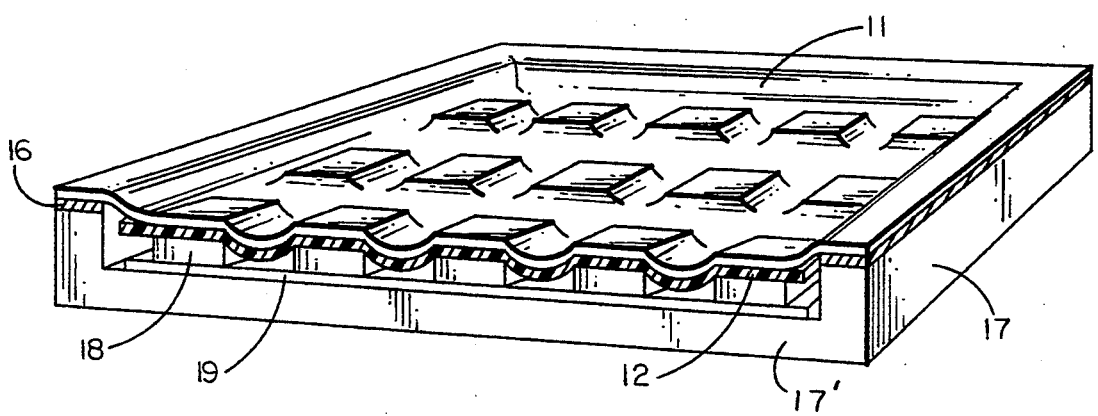
FIG. 2 shows a flexible metallized polymer cover bonded to an electronic assembly.

The assembly in FIG. 2 shows the cross-section of one type of application for the film cover. The cover film top metal surface is identified by numeral 10, after being formed to the underlying assembly. The forming can be achieved by press forming, vacuum forming or other technique. Item 11 shows the metallurgical bond of the metal flange of the cover to the underlying assembly support chassis identified by numeral 12. Item 13 shows discrete electronic devices and item 1;4 shows the assembly circuit card. Item 15 identifies the insulative layer of the film which provides the insulation between the metal cover and the underlying hardware.

While we have described our preferred embodiments of our invention, it will be understood that those skilled in the ad, both now and in the future, may make make various improvements and enhancements which fall within the scope of the claims which follow. These claims should be construed to maintain the proper protection for the invention first disclosed.

What is claimed is:

1. A method of protecting an electronic assembly, comprising the steps of: providing a covering for the electronic assembly to provide environmental protection from external elements, said covering having means to provide an electrically conductive layer to protect the assembly from electrical effects and an electrically insulative layer to protect the assembly from electrically shoaling with the conductive layer; metallurgically sealing the film covering over the electronic assembly while permitting the film to flex and form a film covering while maintaining the functional integrity of the film.

2. A method of protecting an electronic assembly according to claim 1 wherein the film covering comprises a bi-layer film cover for said electronic assembly, said film cover having a metal environmental and electrical protection layer for protection of the electronic assembly components, and a polymer insulative film layer which faces the components to protect them from shorting to the metal layer.

3. A method of protecting an electronic assemblies according to claim 2 wherein the covering film has a metal frame or border around the periphery of the film covering during an intermediate assembly step, and wherein during an intermediate assembly step the metal frame or border around the periphery of the film cover is created by removal of the polymer from around the periphery by mechanical milling.

4. A method of protecting an electronic assembly according to claim 2 wherein the covering film has a metal frame or border around the periphery of the film covering during an intermediate assembly step, and wherein during an intermediate assembly step the metal frame or border around the periphery of the film cover is created by removal of the polymer from around the periphery by laser ablation.

5. A method of protecting an electronic assembly according to claim 2 wherein the covering film has a metal frame or border around the periphery of the film covering during an intermediate assembly step, and wherein during an intermediate assembly step the metal frame or border around the periphery of the film cover is created by removal of the polymer from around the periphery by etching.

* * * * *